United States Patent
Cooper et al.

(10) Patent No.: US 6,233,190 B1
(45) Date of Patent: May 15, 2001

(54) METHOD OF STORING A TEMPERATURE THRESHOLD IN AN INTEGRATED CIRCUIT, METHOD OF MODIFYING OPERATION OF DYNAMIC RANDOM ACCESS MEMORY IN RESPONSE TO TEMPERATURE, PROGRAMMABLE TEMPERATURE SENSING CIRCUIT AND MEMORY INTEGRATED CIRCUIT

(75) Inventors: Christopher B. Cooper; Ming-Bo Liu; Chris G. Martin, all of Boise; Troy A. Manning, Meridian; Stephen L. Casper, Boise; Charles H. Dennison, Meridian; Brian M. Shirley, Boise, all of ID (US); Brian L. Brown, Allen, TX (US); Shubneesh Batra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/386,075

(22) Filed: Aug. 30, 1999

(51) Int. Cl.[7] .................................................. G11C 7/04
(52) U.S. Cl. ............................................. 365/212; 365/211
(58) Field of Search ................................... 327/512, 513; 365/211, 225.7, 212

(56) References Cited

U.S. PATENT DOCUMENTS

| | | |
|---|---|---|
| 4,768,170 | 8/1988 | Hoff .................................... 365/212 |
| 4,931,844 | 6/1990 | Zommer ............................... 357/23.4 |
| 5,213,416 | 5/1993 | Neely et al. .......................... 374/178 |
| 5,276,843 | 1/1994 | Tillinghast et al. .................. 395/425 |
| 5,278,796 | 1/1994 | Tillinghast et al. .................. 365/211 |
| 5,375,093 | * 12/1994 | Hirano .................................. 365/222 |
| 5,485,127 | 1/1996 | Bertoluzzi et al. ..................... 331/69 |
| 5,500,547 | 3/1996 | Yamaguchi et al. .................. 257/359 |
| 5,650,973 | * 7/1997 | Moyer et al. ......................... 365/226 |
| 5,703,521 | 12/1997 | Gantioler et al. ..................... 327/512 |
| 5,774,404 | * 6/1998 | Eto ...................................... 365/222 |
| 5,793,224 | 8/1998 | Sher ....................................... 326/38 |
| 5,811,869 | 9/1998 | Seyyedy et al. ...................... 257/530 |
| 5,812,441 | 9/1998 | Manning .............................. 365/100 |
| 5,812,468 | 9/1998 | Shirley ................................. 365/200 |
| 5,831,923 | 11/1998 | Casper ............................. 365/225.7 |
| 5,872,740 | 2/1999 | Loughmiller et al. ............ 365/225.7 |
| 5,873,053 | 2/1999 | Pricer et al. .......................... 702/130 |
| 5,875,142 | * 2/1999 | Chevallier ............................ 365/212 |

* cited by examiner

*Primary Examiner*—Son Mai
(74) *Attorney, Agent, or Firm*—Wells, St. John, Roberts, Gregory & Matkin P.S.

(57) ABSTRACT

A method for storing a temperature threshold in an integrated circuit includes measuring operating parameters of the integrated circuit versus temperature, calculating a maximum temperature at which the integrated circuit performance exceeds predetermined specifications and storing parameters corresponding to the maximum temperature in a comparison circuit in the integrated circuit by selectively blowing fusable devices in the comparison circuit. The fusable devices may be antifuses. As a result, the integrated circuit is able to provide signals to devices external to the integrated circuit to indicate that the integrated circuit may be too hot to operate properly.

41 Claims, 5 Drawing Sheets

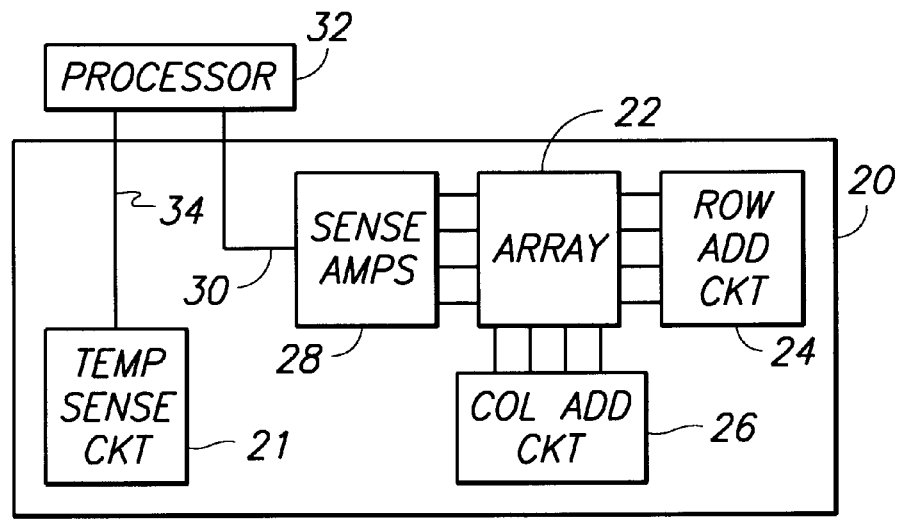
_Fig. 1_
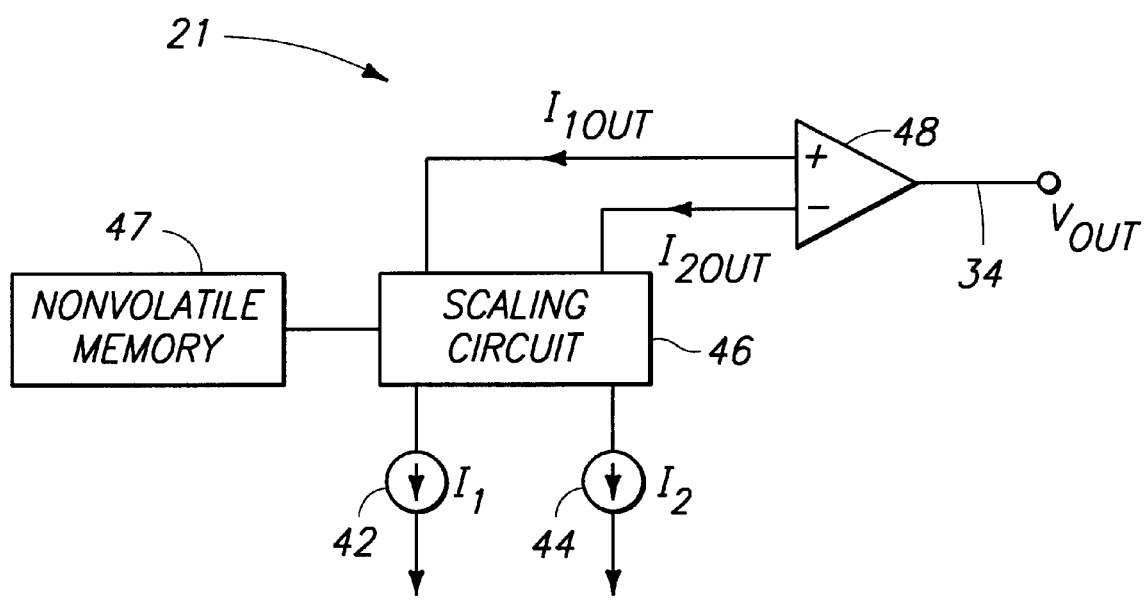
_Fig. 2_

METHOD OF STORING A TEMPERATURE THRESHOLD IN AN INTEGRATED CIRCUIT, METHOD OF MODIFYING OPERATION OF DYNAMIC RANDOM ACCESS MEMORY IN RESPONSE TO TEMPERATURE, PROGRAMMABLE TEMPERATURE SENSING CIRCUIT AND MEMORY INTEGRATED CIRCUIT

TECHNICAL FIELD

The invention relates to a method for storing a temperature threshold in an integrated circuit. The invention also relates to a method for storing a temperature threshold in a dynamic random access memory and a method of modifying dynamic random access memory operation in response to temperature. The invention also relates to a programmable temperature sensing circuit and a memory integrated circuit.

BACKGROUND OF THE INVENTION

It is frequently desired to read and write data from dynamic random access memory (DRAM) integrated circuits (ICs). As the amount of data stored in each DRAM IC increases, there is need to be able to write data into, and read data out of, DRAMs with progressively higher bandwidth. This need requires new kinds of data input/output (I/O) systems and is not easily met.

Previous generations of DRAMs have included fast page mode DRAM and extended data output DRAM. These devices capture input data and drive output data at the falling edge of a column address strobe* (CAS*) signal, where the "*" indicates complement.

In synchronous DRAM (SDRAM), the data trigger point for read and write operations is the rising edge of the clock signal. These conventional DRAMs are referred to as single data rate (SDR) devices. The peak bandwidth (megabytes/second) of a memory system with such memories is given as:

$$\text{(memory system bus width)} \times \text{(clock frequency)} \quad \text{(Eq. 1)}$$

Providing a higher peak bandwidth from a SDR DRAM system thus requires making the clock as fast as possible and expanding the system bus width to be as wide as possible.

However, the clock driver has to drive all DRAMs in the memory system in parallel. Accordingly, higher clock speeds may be difficult to achieve in practice. Additionally, because increasing the bus width also requires greater area on the board holding the DRAM system, it is not easy to increase the peak bandwidth of a SDR DRAM system by increasing bus width.

Double data rate (DDR) DRAM systems are a more attractive way to get a higher data rate and thus greater system bandwidth. In DDR systems, both the rising and falling edges of the clock signal or data strobe signal are trigger points for read and write operations. DDR DRAM systems thus provide double the peak data rate of comparable SDR DRAM systems for the same clock speed and bus width, but require increased timing accuracy.

In turn, new kinds of applications in which DRAMs are used for information storage and retrieval have been developed. These include applications involving PCs, servers, workstations, graphics processors and multimedia processors. As these kinds of applications have developed, needs for progressively larger amounts of data storage and retrieval, and therefore for more rapid data storage and retrieval, have also developed. In order to more rapidly access information stored in DRAMs, new kinds of interface architectures have been developed, including DDR I/O systems.

A differential clock (CLK and CLK*) scheme is used in DDR DRAM memory systems to address the increased timing accuracy requirements. However, there is still a need to synchronize internal clock signals with clocking signals in the circuitry external to the DDR DRAM. Further, because transitions in these clock signals at which data are transferred occur substantially more frequently than those of CAS* signals in SDR DRAMs, the timing tolerances are much tighter. As a result, there is need to maintain tighter timing tolerances in generating internal clocking signals CLK and CLK* that are synchronized with external clocking signals XCLK.

The clock speeds used in DDR DRAMs are increased relative to clock speeds for SDR DRAMs. One effect of the increased clock speed is to generate more heat in the DDR DRAM. In turn, timing of signals within the chip is modified by changes in the operating temperature of the DDR DRAM. When the timing of the signals within the DDR DRAM is shifted by too great an amount, errors occur in exchanging data between the DDR DRAM and circuitry external to the DDR DRAM.

Additionally, processing variations occurring during manufacturing of DRAMs can affect delays within a given DRAM. In turn, this may lead to situations where nominally identical DRAMs show different timing behavior and behavior variations over temperature. Moreover, some specific applications may require different temperature behavior than others.

Further, storage times for data stored in DRAM memory cells are a decreasing function of temperature, as is discussed in more detail in U.S. Pat. Nos. 5,278,796 and 5,276,843, which are assigned to the same assignee as the present invention and which are incorporated herein by reference. As the DRAM temperature increases, the time period during which data stored in memory cells in the DRAM are valid decreases. As a result, excessive temperatures can lead directly to loss of data stored in DRAMs.

What is needed is a capability for detecting the temperature of DRAMs that allows I/O operations to be slowed or suspended when the DRAM temperature exceeds a first threshold temperature and that allows I/O operations to speed up or resume when the temperature of the DRAM drops below a second threshold temperature. What is further needed is an ability to modify threshold temperatures and provide nonvolatile memory for storing modified threshold temperatures in DRAMs in response to measured performance criteria or specific application requirements.

SUMMARY OF THE INVENTION

The invention provides a method of storing a temperature threshold in an integrated circuit. The method includes measuring operating parameters of the integrated circuit versus temperature, calculating a maximum temperature at which the integrated circuit performance exceeds predetermined specifications and storing parameters corresponding to the maximum temperature in a comparison circuit in the integrated circuit by selectively blowing antifuses in the comparison circuit.

In another aspect, the present invention includes a method for storing a temperature threshold in a dynamic random access memory (DRAM). The method includes measuring operating parameters of the DRAM versus temperature, calculating a maximum temperature at which the DRAM performance exceeds predetermined specifications and storing parameters corresponding to the maximum temperature in a nonvolatile memory formed from fusable devices in a comparison circuit in the DRAM.

In yet another aspect, the present invention includes a method of modifying dynamic random access memory operation in response to temperature. The method includes measuring an operating temperature of the memory and comparing the measured operating temperature to a temperature threshold stored in a nonvolatile memory. The temperature threshold was previously stored by blowing fusable devices in the nonvolatile memory. The method also includes reducing a data input/output rate for the memory when the measured operating temperature exceeds the temperature threshold and maintaining the data input/output rate for the memory when the measured operating temperature does not exceed the temperature threshold.

BRIEF DESCRIPTION OF THE DRAWINGS

Preferred embodiments of the invention are described below with reference to the following accompanying drawings.

FIG. 1 is a simplified block diagram of a dynamic random access memory circuit including a temperature detection circuit described below with reference to FIG. 2, in accordance with an embodiment of the present invention.

FIG. 2 is a simplified block diagram of the temperature detection circuit of FIG. 1, in accordance with an embodiment of the present invention.

DETAILED DESCRIPTION OF THE PREFERRED EMBODIMENTS

Figure 3A:
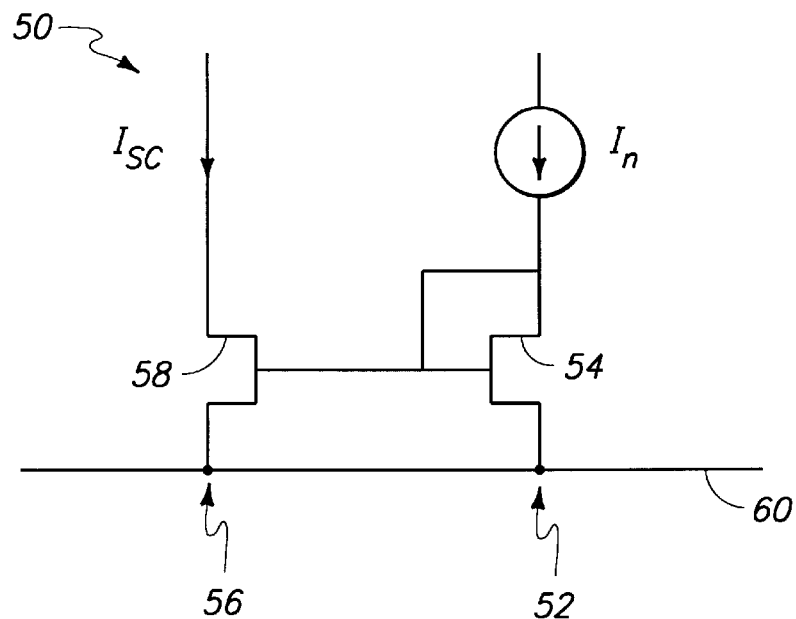
FIGS. 3A and 3B provide simplified schematic diagrams of current mirror circuits, in accordance with the prior art.

This disclosure of the invention is submitted in furtherance of the constitutional purposes of the U.S. Patent Laws "to promote the Progress of Science and useful Arts" (Article 1, Section 8).

FIG. 1 is a simplified block diagram of a dynamic random access memory circuit 20 including a temperature sensing circuit 21, as described below with reference to FIG. 2, in accordance with an embodiment of the present invention. In one embodiment, the memory circuit 20 is a DDR DRAM.

The memory circuit 20 includes an array 22 of memory cells organized into rows and columns, a row addressing circuit 24, a column addressing circuit 26, sense amplifiers 28 and an I/O bus 30 coupling the memory array 22 to pins (not shown) of the memory circuit 20 and thus to an processor 32 such as a computer (not shown), microprocessor or other device. In one embodiment, the memory circuit 20 has an I/O bus 30 that is two bytes wide and that can operate at clock speeds up to at least 400 MHz, providing a data I/O bandwidth of 800 megabytes per second.

The temperature sensing circuit 21 of FIG. 2 includes an output signal line 34 providing an OVERTEMPERATURE output signal to the processor 32 or other device external to the memory circuit 20.

When the memory circuit 20 is being manufactured, a variety of tests are carried out to verify proper operation of the row addressing circuit 24, the column addressing circuit 26, the sense amplifiers 28 and of memory cells in the memory array 22. Tests are also carried out to characterize operation of the memory circuit 20 for different power supply voltages, clock frequencies and the like and to characterize operation of the memory circuit 20 at different temperatures. Results from these tests are then used to repair portions of the memory circuit 20, to sort memory circuits 20 into "speed bins" or ranges of clock speeds over which particular memory circuits 20 operate etc. Results from these tests may also be programmed into the temperature sensing circuit 21 by blowing fusable devices to set a temperature setpoint based on measured characteristics of that memory circuit 20, as is explained below in more detail with reference to FIGS. 2–5.

In normal operation, data coupled from the processor 32 through the I/O bus 30 may be written to the memory array 22. The processor 32 may also read data from the memory array 22 through the I/O bus 30.

When the temperature of the memory circuit 20 rises above the setpoint that has been programmed into the temperature sensing circuit 21, an OVERTEMPERATURE signal is generated and is communicated to the processor 32 via the output signal line 34. The OVERTEMPERATURE signal indicates that data coming from or being written to the memory circuit 20 may be compromised by, for example, temperature-induced clock skew problems.

In one embodiment, the processor 32 may reduce a clock speed for clocking data into or out from the memory circuit 20 in response to presence of the OVERTEMPERATURE signal on the output line 34. In one embodiment, the processor 32 may suspend data read or data write operations in response to presence of the OVERTEMPERATURE signal on the output line 34.

When the temperature of the memory circuit 20 drops below the setpoint temperature that is programmed into the temperature sensing circuit 21, the OVERTEMPERATURE signal on the output signal line 34 indicates that the temperature has dropped and that the memory circuit 20 may be operated at the maximum clock frequency without temperature-induced compromise of data integrity. The processor 32 may then resume or speed up data input or output operations with the memory circuit 20.

FIG. 2 is a simplified block diagram of the temperature detection circuit 21 of FIG. 1, in accordance with an embodiment of the present invention. The temperature detection circuit 21 may be realized in a variety of different ways. In general, temperature setpoint detector circuits 21 employ first 42 and second 44 current (or voltage) generators, where the first 42 and second 44 current generators provide output parameters such as currents $I_1$ and $I_2$ that vary differently with temperature.

The temperature setpoint circuit 21 of FIG. 2 also includes a scaling circuit 46 coupled to a nonvolatile memory 47. In one embodiment, the scaling circuit 46 is formed from, for example, conventional operational amplifiers having gains set using negative feedback. In one embodiment, the scaling circuit 46 is formed using conventional current (or voltage) dividers. In one embodiment, the scaling circuit 46 is formed using current mirrors, with gate area ratios determining relationships between input currents $I_1$ and $I_2$, and output currents $I_{1OUT}$ and $I_{2OUT}$, respectively.

The temperature setpoint circuit 21 of FIG. 2 also includes a comparator circuit 48. The comparator circuit 48 compares the currents $I_{1OUT}$ and $I_{2OUT}$ and generates an output signal $V_{OUT}$ providing an indication of which of the currents $I_{1OUT}$ and $I_{2OUT}$ is larger. The output signal $V_{OUT}$ then may be used to provide the OVERTEMPERATURE signal on the output line 34 of FIG. 1.

Examples of temperature sensing circuits 21 suitable for manufacturing as part of an integrated circuit include, for example, a temperature setpoint detection circuit discussed in U.S. Pat. No. 5,873,053, which is incorporated herein by reference. This circuit compares two subthreshold FET drain currents, where each of the currents is derived from a respective one of two FETs having different geometries and that are provided with different gate voltages. The geometries and gate voltages are chosen so that the two currents will have the same magnitude at a setpoint temperature, with one of the two currents being larger than the other below the setpoint temperature and the other of the two currents being larger above the setpoint temperature. This type of temperature setpoint detection circuit uses two current sources having the same sign, but different slopes, of temperature coefficient.

Another type of temperature sensing circuit 21 is described in U.S. Pat. No. 4,768,170, which is incorporated herein by reference. This temperature setpoint detection circuit also uses two current sources having the same sign, but different slopes, of temperature coefficient. Currents from the two current sources are compared in order to determine when a setpoint temperature has been exceeded. Examples of semiconductor devices employing other types of temperature sensing circuits 21 are described in U.S. Pat. Nos. 5,703,521; 5,500,547; 5,485,127; 5,213,416 and 4,931,844, all of which are incorporated herein 1 by reference.

Other kinds of temperature sensing circuits 21 may use current sources having opposite slopes of temperature coefficient. For example, many kinds of resistors have a positive temperature coefficient of resistance (i.e., resistance increases with increasing temperature). As a result, a voltage drop across a resistor that is biased by a constant current source will increase with temperature. In contrast, a voltage drop across a p-n diode that is forward biased by a constant current source decreases with temperature.

Accordingly, when a first current source (e.g., current source 42) provides a current that is proportional to a voltage drop across a resistor that is biased by a constant current source, and a second current source (e.g., current source 44) provides a current that is proportional to a voltage drop across a diode that is forward biased by another constant current source, the first and second current sources will have opposite slopes of current output versus temperature. Alternatively, the resistor and the diode may be biased by currents having a known relationship to each other.

In all of these arrangements, when the currents $I_1$ and $I_2$ from the two current sources are appropriately scaled and offset, the currents $I_{1OUT}$ and $I_{2OUT}$ will be equal at a threshold temperature, one will be greater than the other below the threshold temperature and the other will be greater above the threshold temperature. The scaled and offset currents $I_{1OUT}$ and $I_{2OUT}$, or voltages derived from these currents, are compared in the comparator 48. The output signal $V_{OUT}$ from the comparator 48 changes from a first logical state when the measured temperature is less than the threshold temperature to a second logical state when the measured temperature is greater than the threshold temperature.

Figure 3B:
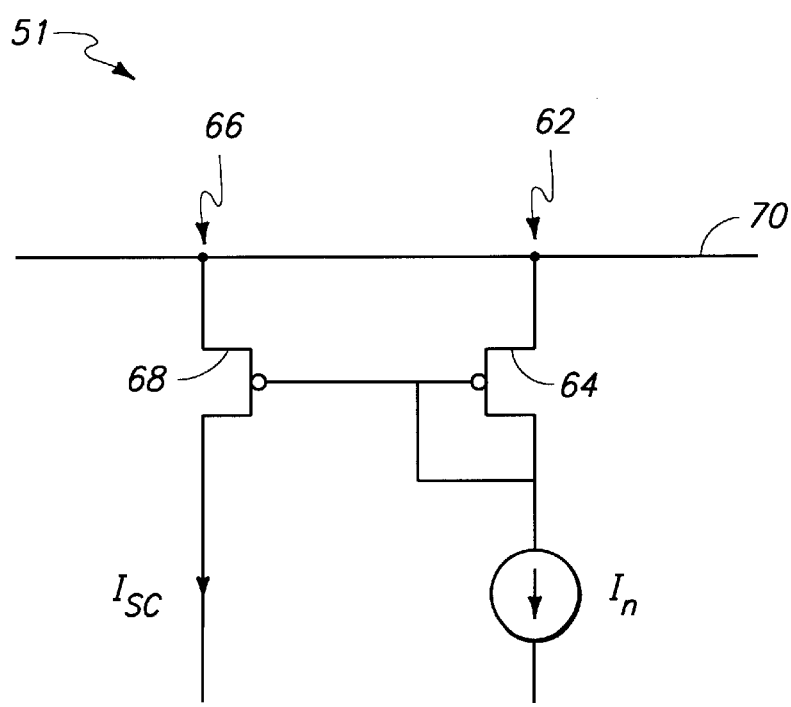

FIGS. 3A and 3B provide simplified schematic diagrams of current mirror circuits 50 and 51, respectively, in accordance with the prior art. The current mirror circuit 50 includes an input section 52 including a first transistor 54 having a drain that is coupled to a gate of the first transistor 54. The current mirror circuit 50 also includes one or more output sections 56. The output section 56 includes a second transistor 58 having a gate that is coupled to the gate of the first transistor 54. Sources of both the first 54 and second 58 transistors are coupled to a common power supply node 60. As a result, both the first 54 and the second 58 transistors have the same gate-source voltage.

When a first current $I_n$ is passed through the drain of the first transistor 54, the drain and the gate of the first transistor 54 together equilibrate to provide a gate-source voltage that corresponds to a saturated drain current equal to the input current $I_n$. In turn, this gate-source voltage is impressed on the second transistor 58. As a result, the saturated drain current of the second transistor 58 is a scaled current $I_{SC}$ that is proportional to the current $I_n$ that is input to the drain of the first transistor 54.

When gate widths $W_1$ and $W_2$ of the first 54 and second 58 transistors are equal, the scaled current $I_{SC}$ is equal to the input current $I_n$. When the gate widths $W_1$ and $W_2$ of the first 54 and second 58 transistors are chosen to be different, the currents $I_{SC}$ and $I_n$ are related as follows:

$$I_{SC}/I_n = W_2/W_1 \qquad \text{(Eq. 2)}$$

Similarly, FIG. 3B shows the current mirror 51 having an input section 62 using a p-channel FET 64 and an output section 66 using a p-channel FET 68. The power supply node 70 is coupled to sources of both FETs 64 and 68. The current mirror 51 operates in a fashion analogous to that of the current mirror 50 but is referenced to the positive power supply node 70 rather than to the negative power supply node 60.

Current mirrors operating analogously to the current mirrors 50 and 51 may also be constructed using other types of transistors, such as bipolar transistors. Additionally, an arbitrarily large number of output sections 56 (or 66) may be coupled to the input section 52 (or 62) to provide a number of scaled output currents $I_{SCn}$, each having a known relationship to the input current $I_n$.

Further, multiple current mirrors 50 and 51 may be interconnected to form the comparator 48 (FIG. 2) or a comparison stage prior to the comparator 48. For example, a first current having a first temperature coefficient may be coupled to a p-channel FET current mirror 51 having an output section 66, and a second current having a second temperature coefficient may be coupled to another p-channel FET current mirror 51 having an output section 66.

When output currents from these two p-channel FET current mirrors 51 are fed to the input 52 and output 56 sections, respectively, of an n-channel FET current mirror 50, a voltage developed on the drain of the output transistor 58 is indicative of which of the two currents is larger. When the current fed into the input section 52 is larger than the current fed into the output section 56, the drain voltage on the output transistor 58 will be low. Conversely, when the current fed into the output section 56 is larger than the current fed into the input section 52, the drain voltage on the output transistor 58 will be high.

Figure 4:
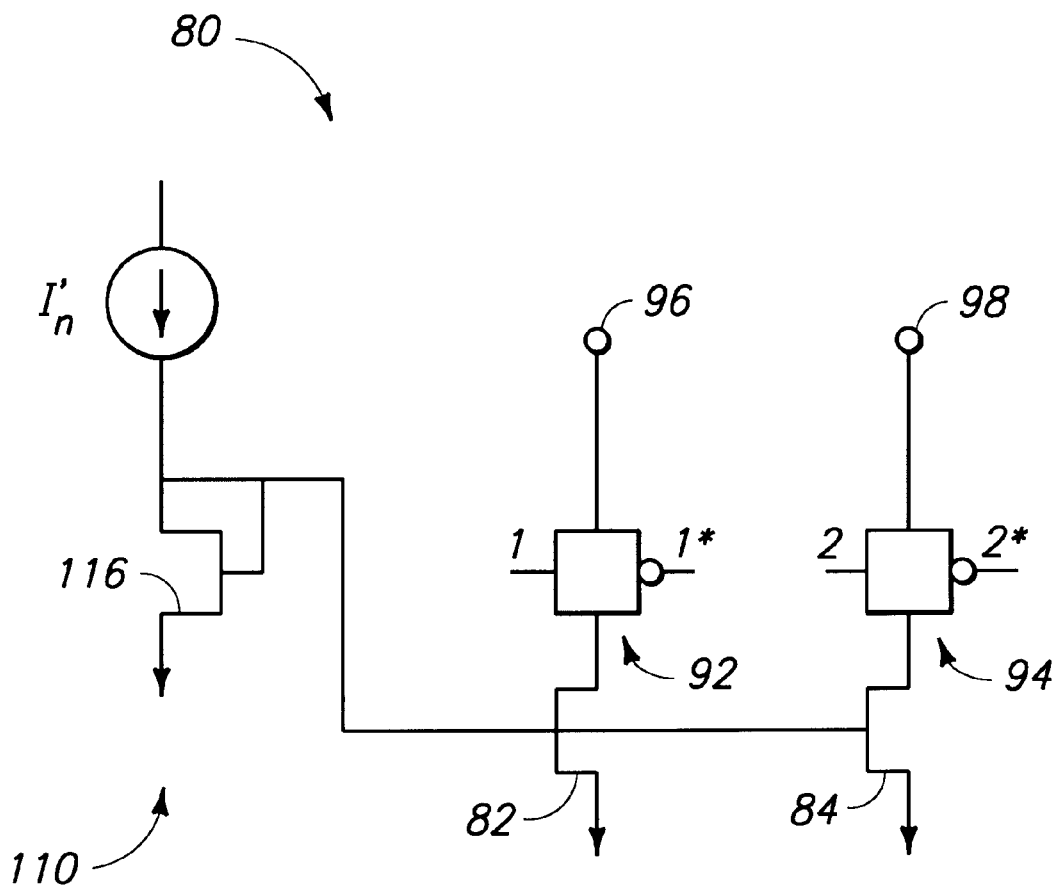
FIG. 4 is a simplified schematic diagram of an adjustable gate width field effect transistor, in accordance with an embodiment of the present invention.
Figure 4:
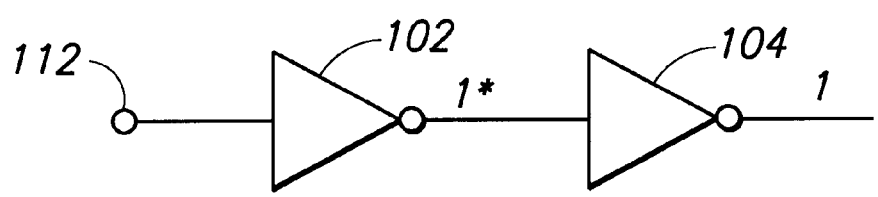
Figure 4:
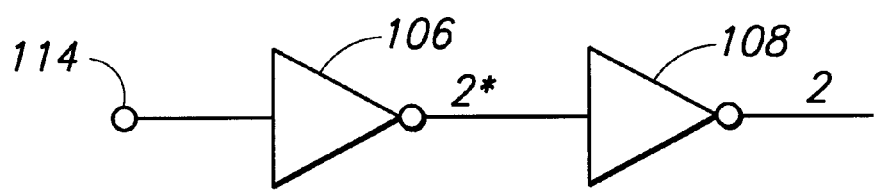

FIG. 4 is a simplified schematic diagram of an adjustable gate width field effect transistor 80, in accordance with an embodiment of the present invention. The adjustable gate width transistor 80 includes multiple transistors 82 and 84, digital switches 92 and 94, outputs 96 and 98 and inverters 102, 104, 106 and 108. The adjustable gate width transistor 80 also includes a gate bias signal source 110 and inputs 112 and 114. While the adjustable gate width transistor 80 is shown as having only two transistors 82 and 84 for clarity of explanation and ease of understanding, it will be understood that more transistors analogous to the transistors 82 and 84 may be included.

The adjustable gate width transistor 80 switches one or more transistors 82 and 84 into or out of a circuit, such as the current mirror 50 of FIG. 3A, that is coupled to one of the outputs 96 and 98. The transistors 82 and 84 are switched into or out of the circuit in response to digital input signals provided at inputs 112 and 114.

For example, when the input 112 is switched to logic "1", signal 1* is set to logic "0", signal 1 is set to logic "1" and the switch 92 is turned ON. When the input 114 is switched to logic "0", signal 2* is set to logic "1", signal 2 is set to logic "0" and the switch 94 is turned OFF. As a result, for these input signals, the transistor 82 is connected to the terminal 96 but the transistor 84 is not connected to the terminal 98.

When the terminal 96 is coupled to the drain of the transistor 54 in FIG. 3A, and the gate of the transistor 82 is coupled to a voltage source that provides a voltage that is related to the gate voltage of the transistors 54 and 58, the transistor 82 modifies (reduces) the gate width ratio $W_2/W_1$ of the current mirror 50 when the switch 92 is turned ON. Similarly, when the terminal 98 is coupled to the drain of the transistor 58 and the gate of the transistor 94 is biased as described above, the transistor 84 modifies (increases) the gate width ratio $W_2/W_1$ of the current mirror 50 when the switch 94 is turned ON.

One way to provide a voltage that is related to the gate voltage in the current mirror 50 is to couple a current $I'_n$ that is a replica of the current $I_n$ into a drain of a separate transistor 116 having drain, gate and source electrodes coupled in the same way as are corresponding electrodes of the transistor 54. When the current $I_n$ is derived, for example, from a current mirror 51 formed from p-channel FETs, the replica current $I'_n$ may be taken from an additional output section 68 of the p-channel current mirror 51.

Many variations of this arrangement for coupling transistors such as 82 and 84 into and out of current mirrors such as the current mirror 50 are possible. In one embodiment, selectively coupling multiple transistors such as the transistor 82 into the output portion 56 of the current mirror 50 allows the gate width ratio $W_2/W_1$ to be increased by a chosen number of successive increments. Alternatively, selectively coupling multiple transistors such as the transistor 84 into the input portion 52 allows the gate width ratio $W_2/W_1$ to be decreased by a chosen number of successive increments.

As a result, the ratio of the currents $I_{SC}/I_n$ may be adjusted in response to digital signals present on inputs such as the inputs 122 and 124. In turn, when the current mirror 50 is used to compare currents having different temperature coefficients or different signs of temperature coefficient to provide the OVERTEMPERATURE signal on the output line 34 of FIG. 1, the temperature threshold or setpoint of the temperature sensing circuit 21 of FIGS. 1 and 2 may be adjusted up or down from an initial setpoint determined from the as-fabricated values of the components of the temperature sensing circuit 21.

Additionally, when the gate bias for the transistors 82 and 84 is derived from other sources, the transistors 82 and 84 may act to provide an offset to the current $I_{SC}$ that the output section 56 of the current mirror 50 (FIG. 3A) provides. When currents from different current mirrors 50, 51 are compared in the comparator 48 (FIG. 2), this offset may be used to adjust the temperature at which two different currents are equal and thus may be used to adjust the setpoint temperature of the temperature sensing circuit 21.

Figure 5:
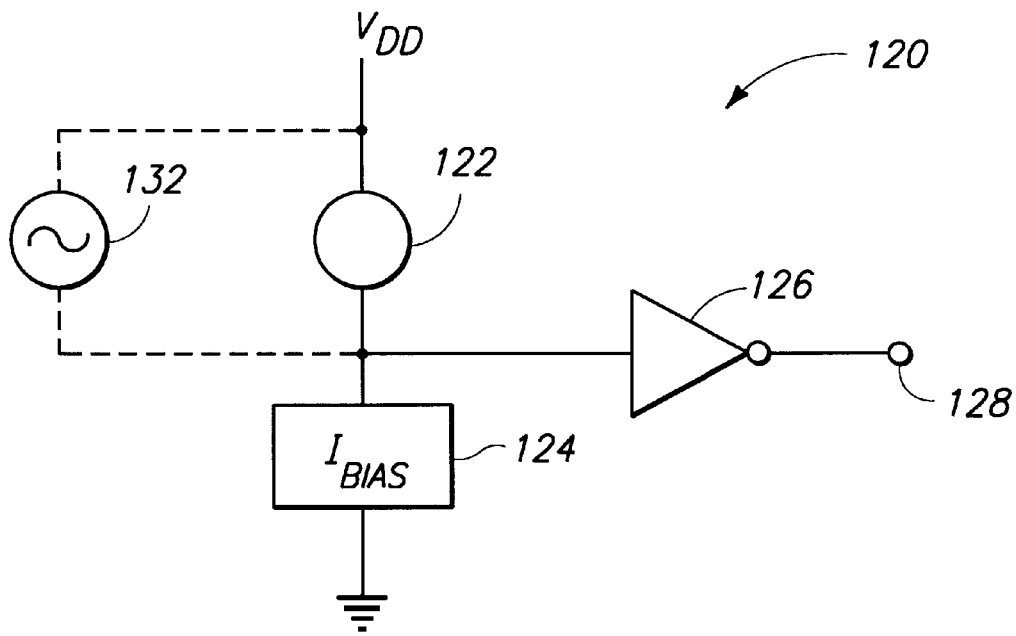
FIG. 5 is a simplified schematic diagram of a fusing circuit for storing a temperature threshold, in accordance with an embodiment of the present invention.
Figure 5:
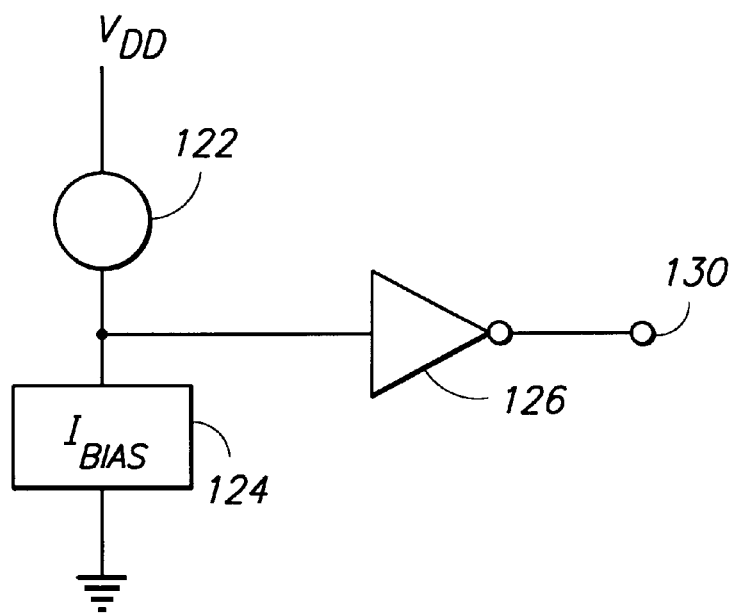

FIG. 5 is a simplified schematic diagram of a fusing circuit 120 for storing a temperature threshold, in accordance with an embodiment of the present invention. The fusing circuit 120 may be used to form the nonvolatile memory 47 of FIG. 2. In one embodiment, the fusing circuit 120 includes a bank of fusable devices 122, bias current sources 124, buffers 126 and outputs 128 and 130. The fusing circuit 120 may also include a programming voltage source 132 couplable (as represented by dashed lines) to the fusable devices 122 if the fusable devices 122 are electrically programmable. The fusable devices 122 may be fuses or antifuses.

Fusable devices 122 are typically two-terminal devices capable of having two different conductive states, corresponding to either an open or a short circuit between the two terminals. Fuses are fusable devices 122 that present a short circuit between the two terminals until they are programmed, which irreversibly causes the fuse to manifest an open circuit between the two terminals. Antifuses are fusable devices 122 that present an open circuit between the two terminals until they are programmed, which irreversibly causes the antifuse to manifest a short circuit or a resistive connection between the two terminals.

Fuses and antifuses are described in U.S. Pat. Nos. 5,811,869 and 5,812,441, which are assigned to the assignee of the present invention and which are incorporated herein by reference. Fuses typically are programmed by focusing an intense light source on a conductive material forming a portion of the fuse to cause an open circuit by ablation of the portion of the conductive material.

Antifuses may be programmed through focusing of radiation from a source external to the integrated circuit on which the antifuses are formed, as discussed in U.S. Pat. No. 5,811,869, which is assigned to the assignee of the present invention and which is incorporated herein by reference. Alternatively, antifuses may be programmed through operation of electrical circuitry on the integrated circuit or by electrical circuitry external to the integrated circuit, as described, for example, in U.S. Pat. Nos. 5,793,224 and 5,812,468, which are assigned to the same assignee as the present invention and which are incorporated herein by reference. Antifuses may provide advantages due to reduced substrate area requirements compared to fuses. When fusable devices 122 are blown using a voltage, the circuit incorporating the fusable devices 122 may be programmed after being encapsulated in a package. States of antifuses may be read using circuitry as described, for example, in U.S. Pat. No. 5,831,923 and 5,872,740, which are assigned to the assignee of the present invention and which are incorporated herein by reference.

Antifuses may be formed in the same manner as DRAM memory cell capacitors and read using similar circuitry. In one embodiment, antifuses are formed to have a silicon nitride dielectric having a thickness of about fifty Angstroms. A resistive element may be used to bias the antifuse by coupling the resistive element and the antifuse in series between a power supply node and ground. A buffer circuit having an input coupled to both the antifuse and the resistive element will provide an output signal having a first state or a second state, depending on whether the antifuse has been blown or not.

The circuit 120 may be used to provide digital signals to the inputs 112 and 114 of FIG. 4 that correspond to the states of the fusable devices 122 associated with the inputs 112 and 114. When a desired temperature setpoint for the memory circuit 20 has been determined by testing the memory circuit 20 as described above with reference to FIG. 1, one or more fusable devices 122 may be blown in the circuit 120 to set the setpoint temperature that is stored in the nonvolatile memory 47 temperature sensing circuit 21 of FIG. 2.

Figure 6:
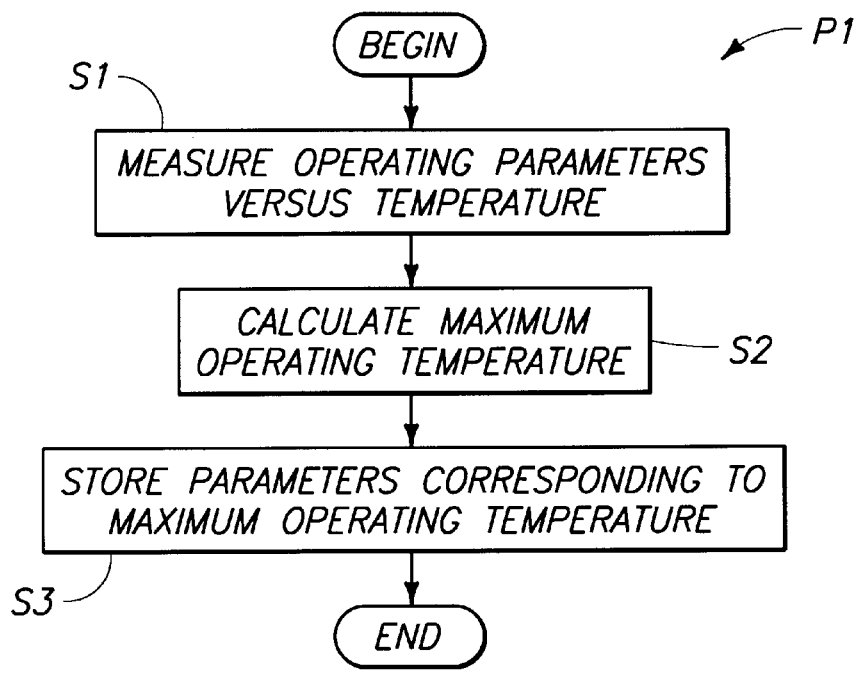
FIG. 6 is a simplified flow chart illustrating a process for storing a temperature threshold in an integrated circuit, in accordance with an embodiment of the present invention.

FIG. 6 is a simplified flow chart illustrating a process P1 for storing a temperature threshold in an integrated circuit, in accordance with the present invention. The process P1 begins with a step S1.

In the step S1, operating parameters of the integrated circuit versus temperature are measured. In one embodiment, measuring operating parameters of the integrated circuit versus temperature comprises measuring operating parameters of a double data rate dynamic random access memory versus temperature. In one embodiment, the step S1 comprises measuring an operating parameter of the DRAM versus temperature. In one embodiment, the step S1 comprises measuring effects of clock skew during data read operations in the DRAM.

In a step S2, a maximum temperature at which the integrated circuit performance exceeds predetermined specifications is calculated.

In a step S3, parameters corresponding to the maximum temperature are stored in the integrated circuit 20. In one embodiment, the step S3 comprises storing parameters in a comparison circuit in the integrated circuit 20 by selectively blowing antifuses in the comparison circuit. In one embodiment, the step S3 comprises selecting a gate width in a field effect transistor in a current mirror circuit to select a current mirroring ratio in the current mirror circuit. In one embodiment, the step S3 comprises blowing fusable devices in a comparison circuit in a DRAM.

In one embodiment, the step S3 comp rises setting a first temperature threshold in a memory integrated circuit by blowing fusable devices in a nonvolatile memory contained in a temperature sensing circuit in the memory integrated circuit. In one embodiment, by repeating the process Pb with a second memory integrated circuit, the step S3 comprises setting a second temperature threshold different than the first temperature threshold in a second memory integrated circuit by blowing fusable devices in a second nonvolatile memory contained in a temperature sensing circuit in the second memory integrated circuit. In one embodiment, the firs t and second memory integrated circuits had the same temperature threshold prior to setting of the first or second temperature thresholds. In one embodiment, the step S3 comprises blowing antifuses. In one embodiment, the step S3 comprises blowing antifuses by coupling a voltage from a voltage source to the antifuses.

In one embodiment, the step S3 comprises selectively blowing antifuses in a comparison circuit in a DRAM. In one embodiment, the step S3 comprises selectively blowing fuses in a comparison circuit in a DRAM. In one embodiment, the step S3 comprises selecting a gate width in a field effect transistor in a current mirror circuit in a DRAM to select a current mirroring ratio in the current mirror circuit. In one embodiment, the step S3 comprises adding an offset current in a current mirror circuit in a DRAM. The process P1 ends following the step S3.

Figure 7:
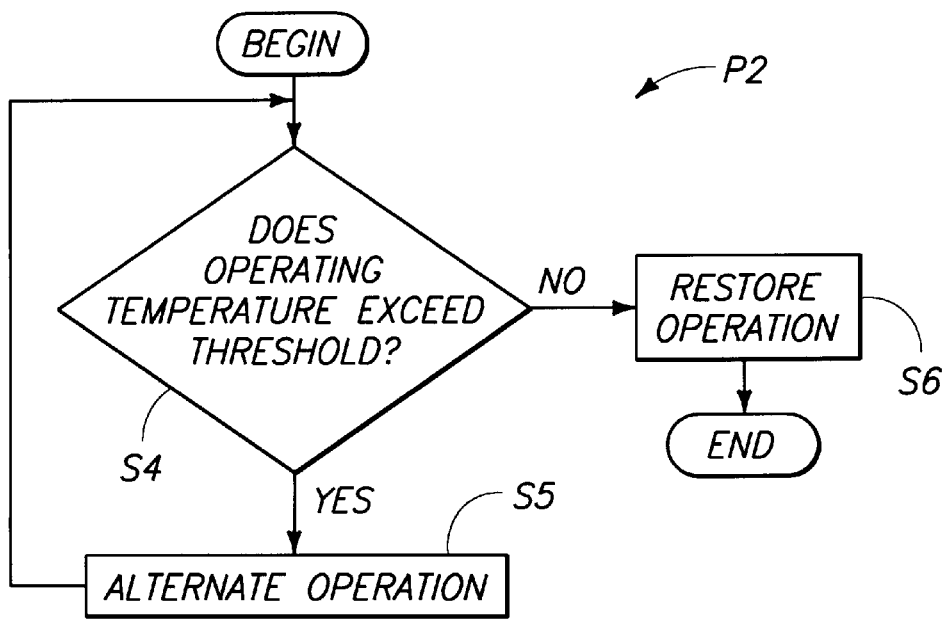
FIG. 7 is a simplified flow chart illustrating a process for operating an integrated circuit, in accordance with an embodiment of the present invention.

FIG. 7 is a simplified flow chart illustrating a process P2 for operating an integrated circuit, in accordance with an embodiment of the present invention.

In a query task S4, the process P2 determines an operating temperature of an integrated circuit. In one embodiment, the query task S4 comprises generating a first current in the integrated circuit. In one embodiment, the first current has a negative temperature coefficient. In one embodiment, the query task S4 comprises generating a second current in the integrated circuit. In one embodiment, the second current has a positive temperature coefficient. In one embodiment, the query task S4 compares the first current to the second current.

In one embodiment, the query task S4 measures an operating temperature of a memory. In one embodiment, the query task S4 compares the measured operating temperature to a temperature threshold stored in a nonvolatile memory, where the temperature threshold was previously stored by blowing fusable devices in the nonvolatile memory. In one embodiment, the query task S4 remeasures an operating temperature of the memory 20 and recompares the measured operating temperature to a temperature threshold. In one embodiment, the query task S4 includes scaling the first and second currents to provide first and second scaled currents and comparing the first and second scaled currents.

In one embodiment, the query task S4 comprises comparing the operating temperature of the memory to a temperature threshold determined from data measured by testing of the memory. In one embodiment, the query task S4 measures an operating temperature of a memory and compares the measured operating temperature to a temperature threshold stored in a nonvolatile memory, where the temperature threshold was previously stored by blowing fusable devices in the nonvolatile memory.

In a step S5, the process P2 generates a first signal when the first current exceeds the second current. In one embodiment, the step S5 comprises generating a signal to reduce a clock speed in the integrated circuit. In one embodiment, the step SS comprises generating a signal to halt data input or output operations of the integrated circuit. In one embodiment, the step S5 reduces a data input/output rate for the memory when the measured operating temperature exceeds the temperature threshold. In one embodiment, the step S5 suspends data input/output operations when the measured temperature exceeds the temperature threshold.

In one embodiment, the step S5 sets a data input/output rate for the memory to a first rate when the measured operating temperature exceeds the temperature threshold. In one embodiment, the step S5 comprises suspending data input/output operations when the measured temperature exceeds the temperature threshold. Control then passes back to the query task S4.

In a step S6, the process P2 generates a second signal when the second current exceeds the first current. In one embodiment, the step S6 maintains the data input/output rate for the memory when the measured operating temperature does not exceed the temperature threshold. In one embodiment, the step S6 increases the data input/output rate when the operating temperature is below the threshold.

In one embodiment, the step S6 sets the data input/output rate for the memory to a second rate when the measured operating temperature does not exceed the temperature threshold. In one embodiment, the step S6 comprises setting the data input/output rate to a rate that is less than the first rate. The process P2 then ends.

The temperature at which the memory circuit 20 of FIG. 1 provides a signal on the output line 34 to indicate that the memory circuit 20 is too hot for reliable operation may then be set without having to resort to a custom masking step, and may be adjusted to account for processing variations that may occur from one memory circuit 20 to another in manufacturing. As a result, greater flexibility is provided in categorization of the memory circuits 20 after the memory arrays 22 and other portions of the memory circuits 20 have been fabricated.

Further, memory circuits 20 made from a common design may be adjusted, after the memory circuits 20 have been formed, to different operating specifications for different applications by setting initially similar temperature setpoints to different values for different ones of the memory circuits 20. This feature may be used to customize memory integrated circuits 20 to particular specifications, even after most manufacturing operations have been completed.

In one embodiment, a nominal temperature setpoint of 90 degrees Celsius is set for the temperature sensing circuit 21 of FIGS. 1 and 2. In one embodiment, a range of +/−10 degrees Celsius may be programmed by blowing fusable devices 122 in the fusing circuit 120. In one embodiment, the range of temperatures over which the temperature sensing circuit 21 may be programmed is provided in five degree increments. In one embodiment, the temperature setpoint may increased or decreased by two or more temperature increments.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is clamed is:

1. A method of storing a temperature threshold in an integrated circuit comprising:
   measuring operating parameters of the integrated circuit versus temperature;
   calculating a maximum temperature at which the integrated circuit performance exceeds predetermined specifications; and
   storing parameters corresponding to the maximum temperature in a comparison circuit in the integrated circuit by selectively blowing antifuses in the comparison circuit.

2. The method of claim 1, further comprising:
   generating a first current in the integrated circuit, the first current having a negative temperature coefficient;
   generating a second current in the integrated circuit, the second current having a positive temperature coefficient;
   comparing the first current to the second current;
   generating a first signal when the first current exceeds the second current; and
   generating a second signal when the second current exceeds the first current.

3. The method of claim 2 wherein generating a first signal comprises generating a signal to reduce a clock speed in the integrated circuit.

4. The method of claim 2 wherein generating a first signal comprises generating a signal to halt data input or output operations of the integrated circuit.

5. The method of claim 1 wherein storing parameters corresponding to the maximum temperature in a comparison circuit in the integrated circuit by selectively blowing antifuses in the comparison circuit comprises selecting a gate width in a field effect transistor in a current mirror circuit to select a current mirroring ratio in the current mirror circuit.

6. The method of claim 1 wherein measuring operating parameters of the integrated circuit versus temperature comprises measuring operating parameters of a double data rate dynamic random access memory versus temperature.

7. A method for storing a temperature threshold in a dynamic random access memory (DRAM) comprising:
   measuring an operating parameter of the DRAM versus temperature;
   calculating a maximum temperature at which the operating parameter exceeds a predetermined specification; and
   storing a parameter corresponding to the maximum temperature in a nonvolatile memory including fusable devices in a comparison circuit in the DRAM.

8. The method of claim 7 wherein measuring an operating parameter of the DRAM comprises measuring effects of clock skew during data read operations in the DRAM.

9. The method of claim 7 wherein storing a parameter corresponding to the maximum temperature in a nonvolatile memory in a comparison circuit in the DRAM comprises selectively blowing antifuses.

10. The method of claim 7 wherein storing a parameter corresponding to the maximum temperature in a nonvolatile memory in a comparison circuit in the DRAM comprises selectively blowing fuses.

11. The method of claim 7 wherein storing a parameter corresponding to the maximum temperature in a nonvolatile memory in a comparison circuit in the DRAM comprises selecting a gate width in a field effect transistor in a current mirror circuit to select a current mirroring ratio in the current mirror circuit.

12. The method of claim 7 wherein storing a parameter corresponding to the maximum temperature in a nonvolatile memory in a comparison circuit in the DRAM comprises adding an offset current in a current mirror circuit.

13. A method of modifying dynamic random access memory operation in response to temperature comprising:
   measuring an operating temperature of the memory;
   comparing the measured operating temperature to a temperature threshold stored in a nonvolatile memory, where the temperature threshold was previously stored by blowing fusable devices in the nonvolatile memory;
   reducing a data input/output rate for the memory when the measured operating temperature exceeds the temperature threshold; and
   maintaining the data input/output rate for the memory when the measured operating temperature does not exceed the temperature threshold.

14. The method of claim 13 wherein reducing a data input/output rate comprises suspending data input/output operations when the measured temperature exceeds the temperature threshold.

15. The method of claim 13, further comprising, after reducing a data input/output rate:
   remeasuring an operating temperature of the memory;
   recomparing the measured operating temperature to a temperature threshold; and
   increasing the data input/output rate when the operating temperature is below the threshold.

16. The method of claim 13 wherein measuring an operating temperature of the memory comprises:
   generating a first current having a positive temperature coefficient;
   generating a second current having a negative temperature coefficient;

scaling the first and second currents to provide first and second scaled currents; and comparing the first and second scaled currents.

17. The method of claim 13 wherein comparing the measured operating temperature of the memory to a temperature threshold stored in a nonvolatile memory comprises comparing the operating temperature of the memory to a temperature threshold determined from data measured by testing of the memory.

18. A method of modifying dynamic random access memory operation in response to temperature comprising:

measuring an operating temperature of the memory;

comparing the measured operating temperature to a temperature threshold stored in a nonvolatile memory, where the temperature threshold was previously stored by blowing fusable devices in the nonvolatile memory;

setting a data input/output rate for the memory to a first rate when the measured operating temperature exceeds the temperature threshold; and setting the data input/output rate for the memory to a second rate when the measured operating temperature does not exceed the temperature threshold.

19. The method of claim 18 wherein setting a data input/output rate to a first rate comprises suspending data input/output operations when the measured temperature exceeds the temperature threshold.

20. The method of claim 18 wherein setting the data input/output rate to a second rate comprises setting the data input/output rate to a rate that is less than the first rate.

21. A method of setting a first temperature threshold in a memory integrated circuit comprising blowing fusable devices in a nonvolatile memory contained in a temperature sensing circuit in the memory integrated circuit.

22. A method of setting a first temperature threshold in a memory integrated circuit comprising blowing fusable devices in a nonvolatile memory contained in a temperature sensing circuit in the memory integrated circuit, further comprising setting a second temperature threshold different than the first temperature threshold in a second memory integrated circuit by blowing fusable devices in a second nonvolatile memory contained in a temperature sensing circuit in the second memory integrated circuit.

23. The method of claim 22 wherein the first and second memory integrated circuits had the same temperature threshold prior to setting of the first or second temperature thresholds.

24. The method of claim 21 wherein setting a first temperature threshold in a memory integrated circuit comprises blowing antifuses.

25. The method of claim 21 wherein setting a first temperature threshold in a memory integrated circuit comprises blowing antifuses by coupling a voltage from a voltage source to the antifuses.

26. A method of setting a first temperature threshold in a memory integrated circuit comprising blowing fusable devices in a nonvolatile memory contained in a temperature sensing circuit in the memory integrated circuit, wherein setting a first temperature threshold in a memory integrated circuit comprises:

measuring operating parameters of the memory integrated circuit versus temperature;

calculating a maximum temperature at which the memory integrated circuit performance exceeds predetermined specifications; and storing parameters corresponding to the maximum temperature in a nonvolatile memory formed from fusable devices in a comparison circuit in the memory integrated circuit.

27. A programmable temperature sensing circuit formed in an integrated circuit, the programmable temperature sensing circuit including an output providing a setpoint signal indicating whether a temperature of the memory integrated circuit is above or below a predetermined setpoint, the programmable temperature sensing circuit comprising:

a first current generator providing a first current having a first temperature characteristic;

a second current generator providing a second current having a second temperature characteristic;

a scaling circuit coupled to the first and second current generators and providing first and second output currents, the scaling circuit modifying the first current to provide the first output current and modifying the second current to provide the second output current, the scaling circuit including fusable devices that have been programmed with data representative of measured temperature behavior of the integrated circuit; and a comparator having inputs coupled to the first and second output currents, an output of the comparator providing the setpoint signal by indicating which of the first and second output currents is larger.

28. The temperature sensing circuit of claim 27 wherein the integrated circuit comprises a dynamic random access memory.

29. The temperature sensing circuit of claim 27 wherein the fusable devices include antifuses and wherein the circuit further comprises an antifuse blowing voltage source.

30. A memory integrated circuit comprising:

a memory array including memory cells;

a row addressing circuit coupled to the memory array;

a column addressing circuit coupled to the memory array;

sense amplifier circuitry coupled to the memory array, the sense amplifier circuitry being configured to read data from or writing data to memory cells in the memory array that are selected by the row and column addressing circuits; and a programmable temperature sensing circuit coupled to the memory array, the programmable temperature sensing circuit including an output providing a signal indicating whether a temperature of the memory integrated circuit is above or below a predetermined setpoint, the programmable temperature sensing circuit comprising:

a first current generator configure to provide a first current having a first temperature characteristic;

a second current generator configured to provide a second current having a second temperature characteristic;

a scaling circuit coupled to the first and second current generators and configured to provide first and second output currents, the scaling circuit modifying the first current to provide the first output current and configured to modify the second current to provide the second output current, the scaling circuit including fusable devices that have been programmed with data representative of measured temperature behavior of the integrated circuit; and a comparator having inputs coupled to the first and second output currents, the comparator being configured to provide an output signal indicating which of the first and second output currents is larger.

31. The memory integrated circuit of claim 30 wherein the memory integrated circuit comprises a double data rate dynamic random access memory.

32. The memory integrated circuit of claim 30 wherein the first current generator provides a first current having a first slope of temperature coefficient and the second current generator provides a second current having a second slope of temperature coefficient.

33. The memory integrated circuit of claim 30 wherein the scaling circuit comprises a current mirror having an input coupled to the first current generator and an output coupled to the comparator.

34. The memory integrated circuit of claim 30 wherein the comparator includes a current mirror having an input coupled to the scaling circuit and an output coupled to the output signal.

35. An apparatus configured to store a temperature threshold in an integrated circuit comprising:
- a tester configured to measure operating parameters of the integrated circuit versus temperature;
- a computer configured to calculate a maximum temperature at which the integrated circuit performance exceeds a predetermined specification; and
- a programming voltage source configure to store parameters corresponding to the maximum temperature in a comparison circuit in the integrated circuit by selectively blowing antifuses in the comparison circuit.

36. The apparatus of claim 35, wherein the tester configured to measure operating parameters of the integrated circuit versus temperature comprises a tester configured to measure operating parameters of a double data rate dynamic random access memory versus temperature.

37. The apparatus of claim 35, wherein the programming voltage source is contained in the integrated circuit and is controlled by the computer to selectively blow the antifuses.

38. The apparatus of claim 35, wherein the programming voltage source is external to the integrated circuit and is controlled by the computer to selectively blow the antifuses.

39. A circuit configured to set a first temperature threshold in a memory integrated circuit comprising:
- an input to the integrated circuit configured to accept data representing the first temperature threshold; and
- a nonvolatile memory including antifuses configured to be selectively blown in a pattern representing the first temperature threshold, the nonvolatile memory being formed in the memory integrated circuit.

40. The circuit of claim 39 wherein the input is configured to be coupled to a voltage source configured to blow antifuses.

41. The circuit of claim 39, wherein setting a first temperature threshold in a memory integrated circuit comprises:
- measuring operating parameters of the memory integrated circuit versus temperature;
- calculating a maximum temperature at which the memory integrated circuit performance exceeds predetermined specifications; and
- storing parameters corresponding to the maximum temperature in a nonvolatile memory formed from antifuses devices in a comparison circuit in the memory integrated circuit.

* * * * *

UNITED STATES PATENT AND TRADEMARK OFFICE
CERTIFICATE OF CORRECTION

PATENT NO. : 6,233,190 B1
DATED : May 15, 2001
INVENTOR(S) : Christopher B. Cooper, et al.

It is certified that error appears in the above-identified patent and that said Letters Patent is hereby corrected as shown below:

Column 5,
Line 35, delete "1".

Column 9,
Line 40, replace "Pb" with -- P1 --.

Column 10,
Line 34, replace "SS" with -- S5 --.

Signed and Sealed this

Sixteenth Day of October, 2001

Attest:

*Attesting Officer*

NICHOLAS P. GODICI
*Acting Director of the United States Patent and Trademark Office*